(12) United States Patent
Fields et al.

(10) Patent No.: US 12,252,782 B2
(45) Date of Patent: Mar. 18, 2025

(54) IN-SITU PECVD CAP LAYER

(71) Applicant: Lam Research Corporation, Fremont, CA (US)

(72) Inventors: Jeremy David Fields, Portland, OR (US); Ian John Curtin, Portland, OR (US); Joseph R. Abel, West Linn, OR (US); Frank Loren Pasquale, Tigard, OR (US); Douglas Walter Agnew, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 205 days.

(21) Appl. No.: 17/756,755

(22) PCT Filed: Dec. 1, 2020

(86) PCT No.: PCT/US2020/062738
§ 371 (c)(1),
(2) Date: Jun. 1, 2022

(87) PCT Pub. No.: WO2021/113257
PCT Pub. Date: Jun. 10, 2021

(65) Prior Publication Data
US 2023/0002887 A1 Jan. 5, 2023

Related U.S. Application Data

(60) Provisional application No. 62/942,654, filed on Dec. 2, 2019.

(51) Int. Cl.
*C23C 16/04* (2006.01)
*C23C 16/40* (2006.01)
(Continued)

(52) U.S. Cl.
CPC .......... *C23C 16/045* (2013.01); *C23C 16/401* (2013.01); *C23C 16/45542* (2013.01);
(Continued)

(58) Field of Classification Search
CPC ................ C23C 16/045; C23C 16/401; C23C 16/45542; C23C 16/52; H01L 21/76819; H01L 21/76837
See application file for complete search history.

(56) References Cited

U.S. PATENT DOCUMENTS

| 6,184,158 B1 | 2/2001 | Shufflebotham et al. |
| 6,943,092 B2 | 9/2005 | Kim |

(Continued)

FOREIGN PATENT DOCUMENTS

| CN | 1856870 A | 11/2006 |
| CN | 104517892 A | 4/2015 |

(Continued)

OTHER PUBLICATIONS

Chinese Third Office Action dated Sep. 15, 2021 issued in Application No. CN 201710839679.7..

(Continued)

*Primary Examiner* — Michael G Miller
(74) *Attorney, Agent, or Firm* — Weaver Austin Villeneuve & Sampson LLP

(57) ABSTRACT

Methods for filling gaps with dielectric material involve deposition using an atomic layer deposition (ALD) technique to fill a gap followed by deposition of a cap layer on the filled gap by a chemical vapor deposition (CVD) technique. The ALD deposition may be a plasma-enhanced ALD (PEALD) or thermal ALD (tALD) deposition. The CVD deposition may be plasma-enhanced CVD (PECVD) or thermal CVD (tCVD) deposition. In some embodiments, the CVD deposition is performed in the same chamber as the (Continued)

ALD deposition without intervening process operations. This in-situ deposition of the cap layer results in a high throughput process with high uniformity. After the process, the wafer is ready for chemical-mechanical planarization (CMP) in some embodiments.

18 Claims, 8 Drawing Sheets

(51) Int. Cl.
  *C23C 16/455* (2006.01)
  *C23C 16/52* (2006.01)
  *H01J 37/32* (2006.01)
  *H01L 21/768* (2006.01)

(52) U.S. Cl.
  CPC ........ *C23C 16/52* (2013.01); *H01J 37/32899* (2013.01); *H01L 21/76819* (2013.01); *H01L 21/76837* (2013.01); *H01J 2237/3321* (2013.01)

(56) References Cited

U.S. PATENT DOCUMENTS

| | | | |
|---|---|---|---|
| 7,041,335 | B2 | 5/2006 | Chung |
| 7,081,271 | B2 | 7/2006 | Chung et al. |
| 7,109,129 | B1 | 9/2006 | Papasouliotis |
| 7,172,792 | B2 | 2/2007 | Wang et al. |
| 7,176,084 | B2 | 2/2007 | Lee et al. |
| 7,393,561 | B2 | 7/2008 | Paranjpe |
| 7,482,247 | B1 | 1/2009 | Papasouliotis et al. |
| 8,357,619 | B2 | 1/2013 | Hasebe et al. |
| 8,728,956 | B2 | 5/2014 | Lavoie et al. |
| 9,257,274 | B2 | 2/2016 | Kang et al. |
| 9,287,113 | B2 | 3/2016 | Kang et al. |
| 9,793,110 | B2 | 10/2017 | Kang et al. |
| 2003/0216006 | A1 | 11/2003 | Li et al. |
| 2006/0165890 | A1 | 7/2006 | Kaushal et al. |
| 2006/0286774 | A1 | 12/2006 | Singh et al. |
| 2007/0243693 | A1 | 10/2007 | Nemani et al. |
| 2007/0259110 | A1 | 11/2007 | Mahajani et al. |
| 2008/0242077 | A1 | 10/2008 | Clark |
| 2008/0317972 | A1 | 12/2008 | Hendriks et al. |
| 2009/0075490 | A1 | 3/2009 | Dussarrat |
| 2009/0286381 | A1 | 11/2009 | Van Schravendijk et al. |
| 2010/0025824 | A1 | 2/2010 | Chen et al. |
| 2013/0164942 | A1 | 6/2013 | Kato et al. |
| 2014/0134827 | A1 | 5/2014 | Swaminathan et al. |
| 2016/0118246 | A1* | 4/2016 | Kang .................. C23C 16/345 438/771 |
| 2017/0148625 | A1 | 5/2017 | Kim et al. |
| 2017/0162384 | A1 | 6/2017 | Chen et al. |
| 2021/0327754 | A1 | 10/2021 | Chandrashekar et al. |

FOREIGN PATENT DOCUMENTS

| | | |
|---|---|---|
| JP | H06177120 A | 6/1994 |
| JP | 2007180362 A | 7/2007 |
| JP | 2009246365 A | 10/2009 |
| JP | 2010245518 A | 10/2010 |
| KR | 20020048617 A | 6/2002 |
| KR | 20070066945 A | 6/2007 |
| KR | 100818714 B1 | 4/2008 |
| KR | 20100124807 A | 11/2010 |
| KR | 20110034822 A | 4/2011 |
| KR | 20130062256 A | 6/2013 |
| KR | 20190002269 A | 1/2019 |
| TW | 201144475 A | 12/2011 |
| WO | WO-2012045509 A1 | 4/2012 |

OTHER PUBLICATIONS

Choi, Gyu-Jin et al., (2009) "Plasma-enhanced atomic layer deposition of TiO2 and Al-doped TiO2 films using N2O and O2 reactants," Journal of the Electrochemical Society, 156(9):G138-G143.
CN Office Action dated Mar. 29, 2024 in CN Application No. 202080083785.7 with English Translation.
International Preliminary Report on Patentability and written opinion dated Jun. 16, 2022 in PCT Application PCT/US2020/062738.
International Search Report and Written Opinion dated Apr. 18, 2024 in PCT Application No. PCT/US2023/084005.
International Search Report and Written Opinion dated Mar. 19, 2021, in Application No. PCT/US2020/062738.
KR Office Action dated May 20, 2022, in Application No. KR10-2022-0023506 with English translation.
KR Office Action dated Nov. 23, 2021, in Application No. KR1020140131380 with English translation.
KR Office Action dated Oct. 19, 2022, 2022, in Application No. KR10-2022-0023506 with English translation.
KR Office Action dated Sep. 5, 2023, in Application No. KR10-2023-0008206 with English Translation.
Notice of Allowance dated Sep. 2, 2021 in U.S. Appl. No. 16/428,067.
U.S Advisory Action dated Dec. 4, 2013 in U.S. Appl. No. 13/084,399.
US Final Office Action dated Jun. 10, 2015 issued in U.S. Appl. No. 14/231,554.
US Notice of Allowance dated Aug. 22, 2017 issued in U.S. Appl. No. 14/987,542.
US Notice of Allowance dated Aug. 31, 2015 issued in U.S. Appl. No. 14/231,554.
US Notice of Allowance dated Jan. 15, 2014 issued in U.S. Appl. No. 13/084,399.
US Notice of Allowance dated Jun. 20, 2017 issued in U.S. Appl. No. 14/987,542.
US Notice of Allowance dated Mar. 24, 2021 issued in U.S. Appl. No. 16/428,067.
US Notice of Allowance dated Mar. 7, 2019 issued in U.S. Appl. No. 15/654,186.
US Notice of Allowance dated Oct. 1, 2015 issued in U.S. Appl. No. 14/137,860.
US Notice of Allowance [Supplemental Notice of Allowability] dated Oct. 22, 2015 issued in U.S. Appl. No. 14/137,860.
US Office Action dated Dec. 7, 2020 issued in U.S. Appl. No. 16/428,067.
US Office Action dated Feb. 3, 2017 issued in U.S. Appl. No. 14/987,542.
US Office Action dated Jan. 2, 2015 issued in U.S. Appl. No. 14/231,554.
US Office Action dated Mar. 15, 2013 issued in U.S. Appl. No. 13/084,399.
US Office Action dated Mar. 2, 2015 issued in U.S. Appl. No. 14/137,860.
US Office Action dated Nov. 9, 2018 issued in U.S. Appl. No. 15/654,186.
U.S. Restriction Requirement dated Aug. 7, 2020 in U.S. Appl. No. 16/428,067.
U.S. Restriction Requirement dated Oct. 21, 2016 in U.S. Appl. No. 14/987,542.
U.S. Supplementary Notice of Allowance dated Apr. 17, 2019 in U.S. Appl. No. 15/654,186.
U.S. Non-Final Office Action dated Jun. 4, 2024 in U.S. Appl. No. 17/465,555.
U.S. Notice of Allowance dated Nov. 13, 2024 in U.S. Appl. No. 17/465,555.

\* cited by examiner

IN-SITU PECVD CAP LAYER

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

The fabrication of integrated circuits includes many diverse processing steps. One of the operations frequently employed is the deposition of a dielectric film into a gap between features patterned over or into silicon substrates. One of the goals in depositing such material is to form a void-free, seam-free fill in the gap. As device dimensions become smaller in the context of DRAM, flash memory and logic, for example, it has become increasingly difficult to achieve this type of fill.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect of the disclosure relates to methods of processing substrates having gaps to be filled with dielectric material. In some embodiments, the methods include: providing a substrate having a gap to a processing chamber, the substrate having a top surface with the gap recessed from the top surface; performing multiple plasma-enhanced atomic layer deposition (PEALD) cycles to fill the gap with a first dielectric film, where the first dielectric film is characterized by a first indentation over the gap and above the plane of the top surface; and in the processing chamber, depositing a second dielectric film over the first dielectric film by a plasma enhanced chemical vapor deposition (PECVD).

In some embodiments, the second dielectric film fills the first indentation and includes a second indentation that is at least 10% smaller than the first indentation. In some embodiments, the second indentation is at least 20%, at least 30%, at least 40%, at least 50%, at least 60%, at least 70%, or at least 80% smaller than the first indentation. In some embodiments, the second dielectric film is between 1 and 3 microns thick. In some embodiments, the second dielectric film is between 100 Angstroms and 1 micron thick. In some embodiments, the processing chamber is a multi-station processing chamber. The multiple PEALD cycles may be performed in one or more first stations of the multi-station processing chamber and the PECVD process performed in one or more second stations of the multi-station processing chamber, the one or more first stations being different stations than the one or more second stations. In some embodiments, after deposition of the second dielectric film, the substrate is ready for chemical-mechanical planarization (CMP). In some embodiments, the method further includes performing a CMP process to form a planarized surface including one or both of the first and second dielectric films.

Another aspect of the disclosure relates to methods of processing substrates having gaps to be filled with dielectric material. In some embodiments, the methods include: providing a substrate having a gap to a processing chamber, the substrate having a top surface with the gap recessed from the top surface; performing multiple atomic layer deposition (ALD) cycles to fill the gap with a first dielectric film, where the first dielectric film is characterized by a first indentation over the gap and above the plane of the top surface; and in the processing chamber, depositing a second dielectric film over the first dielectric film by a chemical vapor deposition (CVD).

In some embodiments, the second dielectric film fills the first indentation and includes a second indentation that is at least 10% smaller than the first indentation. In some embodiments, the second indentation is at least 20%, at least 30%, at least 40%, at least 50%, at least 60%, at least 70%, or at least 80% smaller than the first indentation. In some embodiments, the second dielectric film is between 1 and 3 microns thick. In some embodiments, the second dielectric film is between 100 Angstroms and 1 micron thick.

In some embodiments, the second dielectric film fills the first indentation and includes a second indentation that is at least 10% smaller than the first indentation. In some embodiments, the second indentation is at least 20%, at least 30%, at least 40%, at least 50%, at least 60%, at least 70%, or at least 80% smaller than the first indentation. In some embodiments, the second dielectric film is between 1 and 3 microns thick. In some embodiments, the second dielectric film is between 100 Angstroms and 1 micron thick.

These and other aspects are described below with reference to the associated drawings.

DETAILED DESCRIPTION

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry may have a diameter of 200 mm, or 300 mm, or 450 mm. In addition to semiconductor wafers, other work pieces that may take advantage of the methods an and apparatus described herein including various articles such as printed circuit boards, glass panels, and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Provided herein are methods and apparatus for filling gaps with dielectric material. The methods involve deposition using an atomic layer deposition (ALD) technique to fill a gap followed by deposition of a cap layer on the filled gap by a chemical vapor deposition (CVD) technique. The ALD deposition may be a plasma-enhanced ALD (PEALD) or thermal ALD (tALD) deposition. The CVD deposition may be plasma-enhanced CVD (PECVD) or thermal CVD (tCVD) deposition. In some embodiments, the CVD deposition is performed in the same chamber as the ALD deposition without intervening process operations. This in-situ deposition of the cap layer results in a high throughput process with high uniformity. After the process, the wafer is ready for chemical-mechanical planarization (CMP) in some embodiments.

Figure 1:
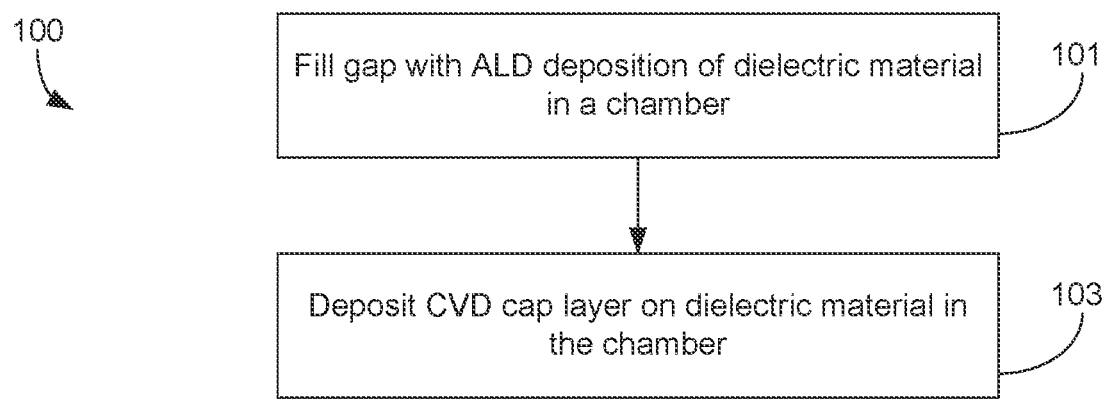
FIG. 1 shows a flowchart of a method of filling and capping a gap with dielectric material.

FIG. 1 shows operations of a method 100 according to various embodiments. First, in an operation 101, a gap on a substrate is filled with dielectric material using an ALD process. The gap may be characterized by having a high aspect ratio or a narrow opening. Gap geometries depend on the application, with example applications including 3D NAND slit fill, DRAM pen gapfill, and SSL separation mask oxide fill. For 3D NAND slit gapfill, example gap geometries may be depths of 2-10 μm with openings of 200-500 nm. For DRAM applications, example gap geometries may be depths of 75-300 nm and openings of 5-50 nm. Aspect ratios may be 4:1-30:1, for example. It will be appreciated, however, that the methods described herein may be used for fill of gaps of any geometry. Additional applications include, 3D NAND pillar or hole fill, DRAM STI, logic STI, PCRAM STI, MRAM, and logic PMD. As indicated above, the ALD method may be a PEALD or a tALD process. Examples of ALD processes are described further below.

Figure 2:
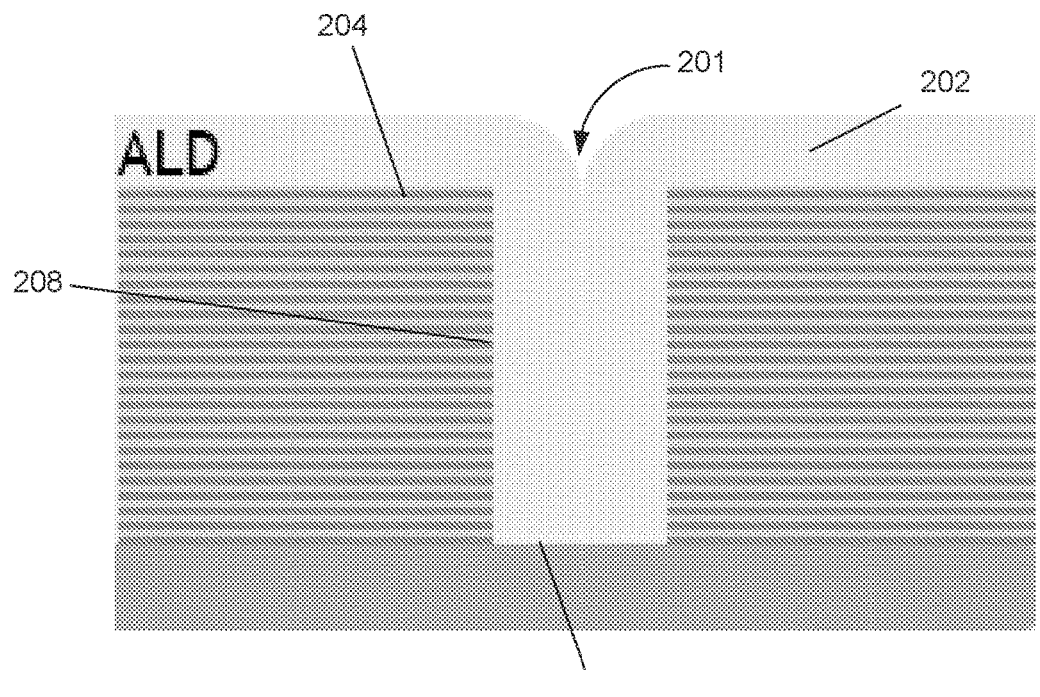
FIG. 2 shows a filled gap after atomic layer deposition (ALD) of dielectric material.

The ALD process may be allowed to continue until the gap is completely filled with the dielectric material. FIG. 2 shows an example of a filled gap after operation 101. The gap is defined at least in part by sidewalls 208 that extend from a bottom surface 206 to a top surface 204. The bottom surface 206 may be a curved or point surface or generally planar surface as depicted in the example of FIG. 2. The top surface 204 is typically, though not necessarily, a generally planar surface. A dielectric film 202 completely fills the gap. The dielectric film is characterized by a divot or gouge 201. This gouge 201 is a result of the conformality ALD process, and in particular, that film at least partially grows from the sidewalls 208 to the center of the feature. The depth of the gouge 201 may depend on the ALD process, the gap geometry, and the thickness of the film above the gap. In some embodiments, it is greater than 60 nm, or greater than 100 nm. Operation 101 is performed at least until the gouge vertex is above the top surface 206, and may at least 50 nm, 100 nm, 200 nm, or 500 nm above the top surface. This ensures that during subsequent planarization, the gap remains filled. Left alone, however, the gouge can cause problems in subsequent processing, including in subsequent CMP, etch, or photolithography operations. During etch and CMP steps, the gouge can cause an uneven amount of material to be removed from the top the structure, resulting in too much material being removed from the filled feature, generating defects which affect device performance. In photolithography, a flat surface produces optimal performance. The gouge resulting from the ALD fill can creates a topography on the top surface of the device that diminishes the accuracy of the subsequent lithography operations, which can also generate defects affecting device performance.

Figure 3:
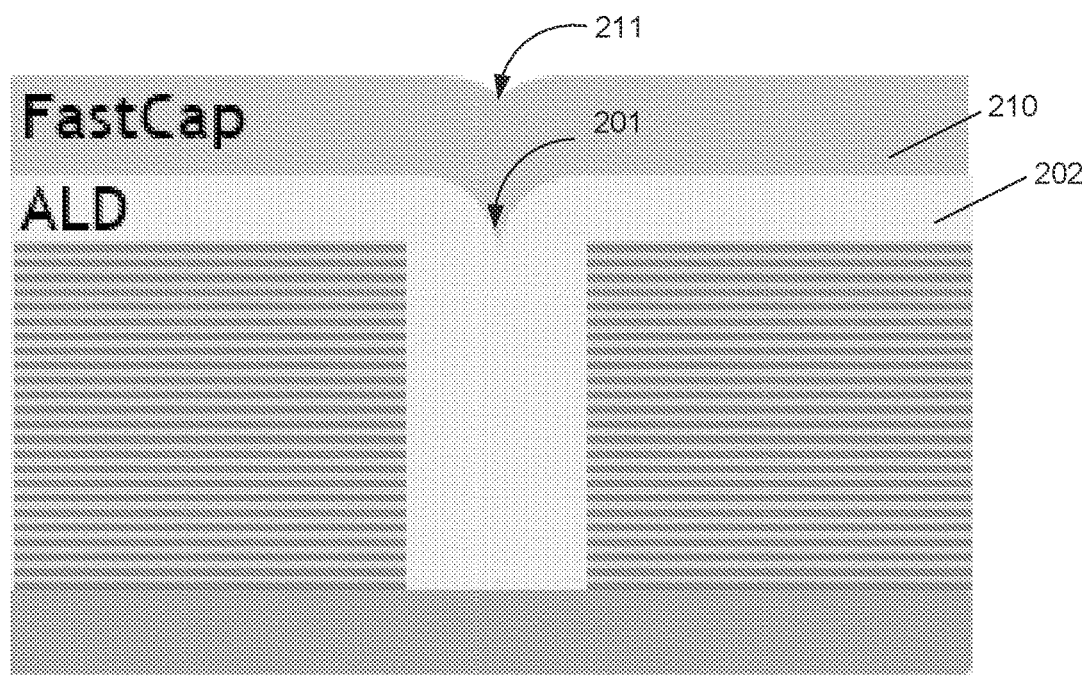
FIG. 3 shows the substrate of FIG. 2 after a cap layer is deposited by a chemical vapor deposition (CVD) process.
Figure 4:
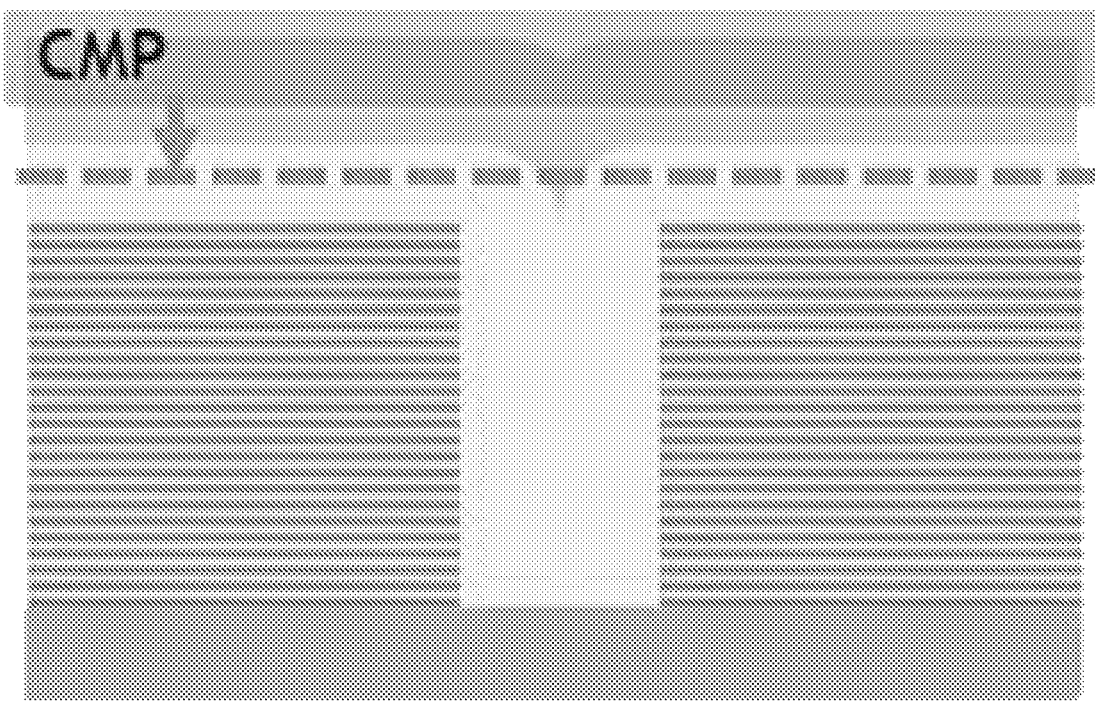
FIG. 4 shows the substrate of FIG. 3 during subsequent processing.

Returning to FIG. 1, a CVD cap layer is then deposited on the dielectric fill material in the same chamber in an operation 103. As indicated above, the cap layer may be deposited by PECVD or tCVD. Examples of CVD processes are described further below. Depositing by CVD allows for a thick film to be quickly deposited, which preferentially fills in the gouge resulting in a flatter film, reducing the frequency of the generation of defects in subsequent processing. And, by depositing it in the same chamber as the ALD gap fill, the number of transfer operations and processing tools is greatly reduced. FIG. 3 shows an example of the filled gap after operation 103. A cap film 210 is on dielectric film 202. Notably, the gouge 211 in the cap film 210 is significantly reduced as compared to gouge 201. The gouge may be reduced for example, by at least 20%, at least 30%, at least 40%, at least 50%, at least 70%, at least 80%, or at least 90%. Example thicknesses of the cap layer range from 1-3 kÅ. In some embodiments, thinner layers, e.g., 100-1000 Å, may be deposited. FIG. 4 shows an example of subsequent processing, in this case CMP, which may be performed directly after cap layer deposition. The CMP process may removes a top layer of dielectric and may leave the filled in gouge. In some embodiments, the CMP process may remove only the CVD deposited film. In some embodiments, the CMP process may remove ALD deposited film, leaving the filled in gouge.

In the example of FIG. 1, the ALD and CVD depositions are performed in the same chamber. This allows a quick process with minimal transition time. However, in some other embodiments, the ALD and CVD depositions can be performed in different chambers.

ALD Gapfill

As described above, the ALD process fills the gap with a dielectric material, typically, a silicon-containing dielectric material. The ALD process may be ALD-only, or in some embodiments, may have one or more etch or inhibition operations. For example, the gap may be filled with a deposition-etch-deposition process or a deposition-inhibition-deposition operation, or some combination of these. In such embodiments, the etch or inhibition operations preferentially can etch or inhibit at the top of the feature.

Figure 5A:
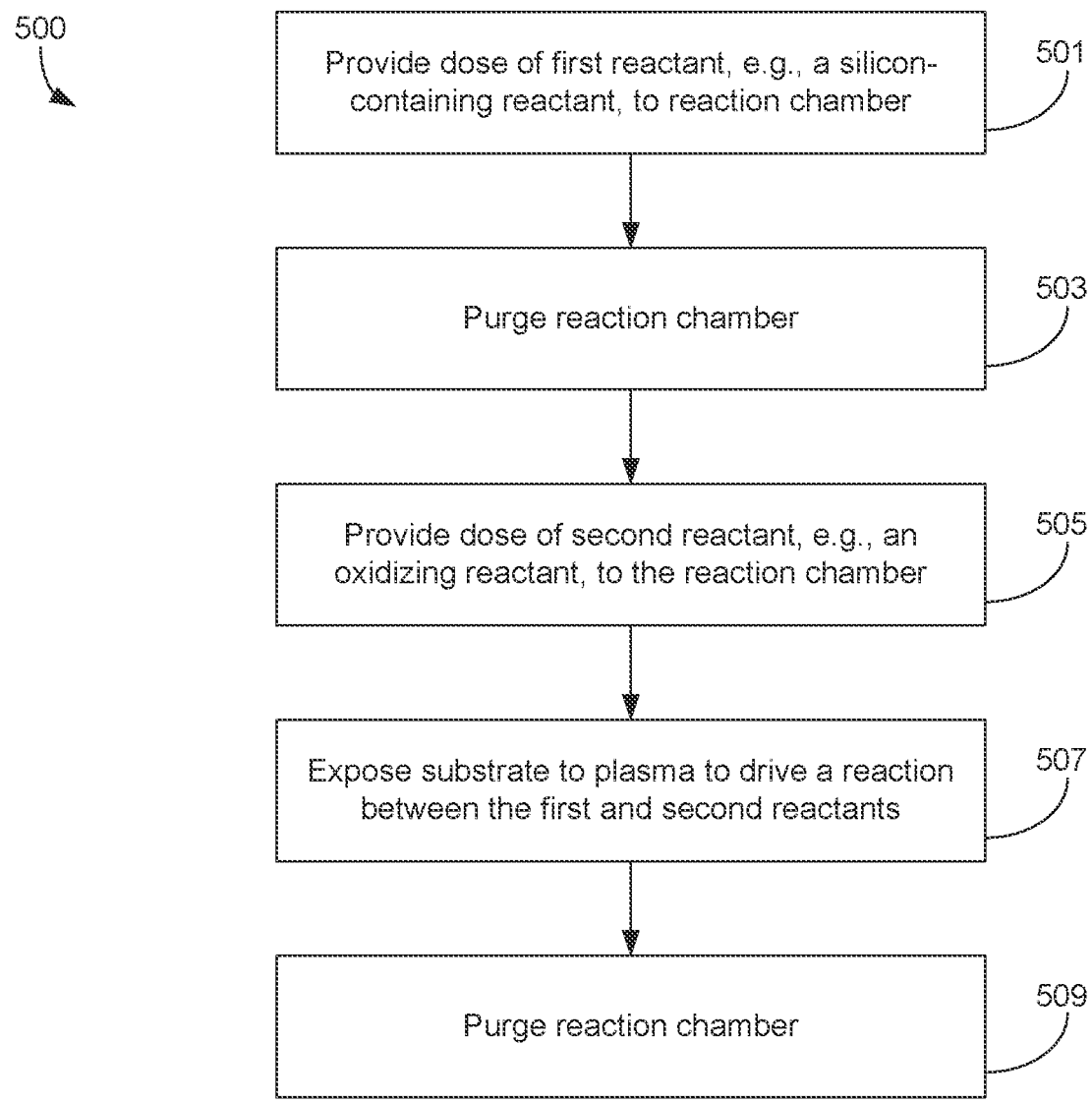
FIG. 5A shows a flowchart of a method of filling a gap through a plasma enhanced atomic layer deposition (PEALD) process.

In some embodiments, a PEALD process is used. FIG. 5A presents a flowchart for a method of performing a plasma enhanced atomic layer deposition process 500. The process 500 begins at operation 501, where a dose of a first reactant is provided to a reaction chamber containing a substrate. The substrate will have gaps therein that are to be filled through the PEALD process. In various cases, the first reactant may be a silicon-containing reactant. Next, at operation 503 the reaction chamber is purged, for example with an inert gas or a nitrogen carrier gas. This helps remove any remaining first reactant from the reaction chamber.

At operation 505, the second reactant is provided to the reaction chamber. In certain cases, the second reactant is an oxidizing reactant. In one example, it is oxygen. The second reactant may also be a mix of reactants. In a particular embodiment, the second reactant is a flow of oxygen and nitrous oxide. The second reactant is provided in operation 505, which may include pre-flowing the reactant before flowing the reactant coincident with plasma activation in operation 507. When the plasma is activated, it drives a reaction between the first and second reactants on the surface of the substrate. Next, the plasma is extinguished, and then the reaction chamber is purged, for example with inert gas or a nitrogen carrier gas. This operation 509 is referred to as the post-RF purge. The method 500 is repeated a number of times to fill the gap. A tALD method may also be performed, with operation 507 omitted.

At least one of the reactants will generally contain an element that is solid at room temperature, the element being incorporated into the film formed by the ALD method. This reactant may be referred to as a principal reactant. The principal reactant may be silicon-containing or contain another semiconductor (e.g., germanium, etc.). The other reactant is sometimes referred to as an auxiliary reactant or a co-reactant. Non-limiting examples of co-reactants include oxygen, ozone, hydrogen, hydrazine, water, carbon monoxide, nitrous oxide, ammonia, alkyl amines, and the like. The co-reactant may also be a mix of reactants, as mentioned above.

The PEALD process may be used to fill gaps with a wide variety of film types. While much of the discussion herein focuses on the formation of undoped silicon oxides, other film types such as nitrides, carbides, oxynitrides, carbon-doped oxides, nitrogen-doped oxides, borides, etc. may also be formed. Oxides include a wide range of materials including undoped silicate glass (USG), fluorosilicate glass (FSG), and other doped silicate glass. Examples of doped glasses included boron doped silicate glass (BSG), phosphorus doped silicate glass (PSG), and boron phosphorus doped silicate glass (BPSG). Still further, the PEALD/PECVD process may be used for metal deposition and feature fill.

While the disclosed embodiments are not limited to particular reactants, an example list of reactants is provided below.

In certain embodiments, the deposited film is a silicon-containing film. In these cases, the silicon-containing reactant may be for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, tetra-ethyl-ortho-silicate (also known as tetra-ethoxy-silane or TEOS) and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. Further examples trisilylamine ($N(SiH_3)$) and bis(diethylamino)silane, BDEAS.

CVD Cap

Figure 5B:
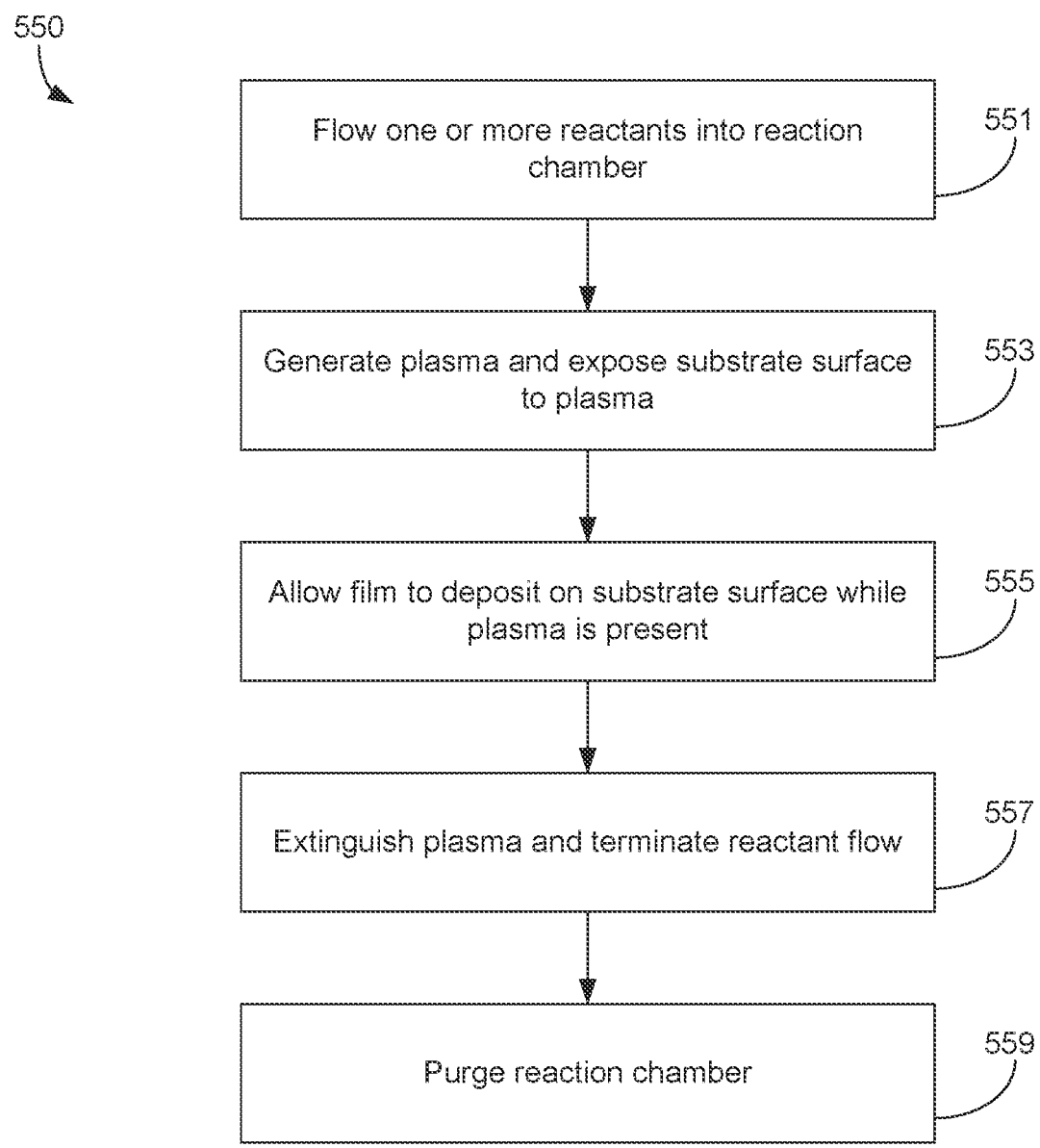
FIG. 5B shows a flowchart of a method of depositing a cap layer through a plasma enhanced chemical vapor deposition (PECVD) process.

FIG. 5B shows a flow chart for a method 550 of depositing a cap layer with PECVD. The method 550 may be performed after the method 500 of FIG. 5A. The PECVD method generally begins by flowing one or more reactants into the reaction chamber at operation 551. The reactant delivery may continue as plasma is generated in operation 553. The substrate surface is exposed to plasma, which causes deposition to occur on the ALD-deposited dielectric fill layer in operation 555. This process continues until a desired film thickness is reached. At operation 557, the plasma is extinguished and the reactant flow is terminated. Next, the reaction chamber is purged at operation 559.

In some embodiments, there is no downtime between a PEALD process and a PECVD process. For example, the PEALD process may end by extinguishing the plasma, performing the post-RF purge (with or without a pump down), and then immediately flowing the PECVD reactant(s).

A transition phase may be employed between the PEALD and PECVD phases. The conditions employed during such transition phase can be different from those employed in either the PEALD or the PECVD phases. In some embodiments, the conditions permit simultaneous ALD surface reactions and CVD type gas phase reactions. The transition phase may involve exposure to a plasma, which may be pulsed for example. Further, the transition phase may involve delivery of one or more reactants a low flow rate, i.e., a rate that is significantly lower than that employed in the corresponding ALD phase of the process.

The PECVD reaction may be performed with either the same reactants as the ALD reaction, or with different reactants. For example, the PECVD reaction is performed with TEOS and/or silane. The TEOS and silane reactants have been found to be especially useful in practicing the PECVD reaction. Generally, the reactants listed above in the PEALD Reactants section may be used in the PECVD reaction. However, in some embodiments, the reactants are different with TEOS or silane used for PECVD and an aminosilane used for PEALD.

In transitioning from PEALD to PECVD, in some embodiments, the RF power may be decreased. For example, for PEALD, RF power may be 1250-6000 W and for PECVD, RF power may be 1000-6000 W. However, in some embodiments, for PEALD, RF power may be at least 3 kW, or 4 kW, or 5 kW. For PECVD, in some embodiments, RF power may be between 1 kW and 2 kW, e.g., 1250 W. Example RF times for each PEALD cycle are 0.15 s-0.6 s. Example RF times for the PECVD deposition are 1-200 s. A tCVD method may also be performed without the plasma.

In some embodiments, the ALD and CVD processes may be performed in a multi-station chamber. According to various embodiments, each of the ALD and CVD stations may be independently performed in static mode (process completely in one station) or in damascene mode (indexing between stations). Damascene mode may be used to impart better uniformity. Thus, in a multi-station chamber any one of the following processes may be performed:

1) ALD and CVD in static mode (process completely on one station), or
2) ALD in static mode+CVD process in damascene mode with indexing between stations to impart better uniformity, or
3) ALD in damascene mode and CVD in static mode, or
4) ALD in damascene mode, CVD in damascene mode.

In embodiments with ALD and CVD both in static mode, the processes may or may not be performed in the same station.

In some embodiments, transitioning between ALD and CVD includes indexing the substrate from an ALD station to a CVD station. Using different stations to perform ALD and CVD can facilitate the use of different compounds and process conditions for ALD and CVD processes.

Apparatus

A suitable apparatus for performing the disclosed methods typically includes hardware for accomplishing the process operations and a system controller having instructions for controlling process operations in accordance with the present invention. For example, in some embodiments, the hardware may include one or more PEALD, PECVD or joint PEALD/PECVD process stations included in a process tool.

Figure 6:
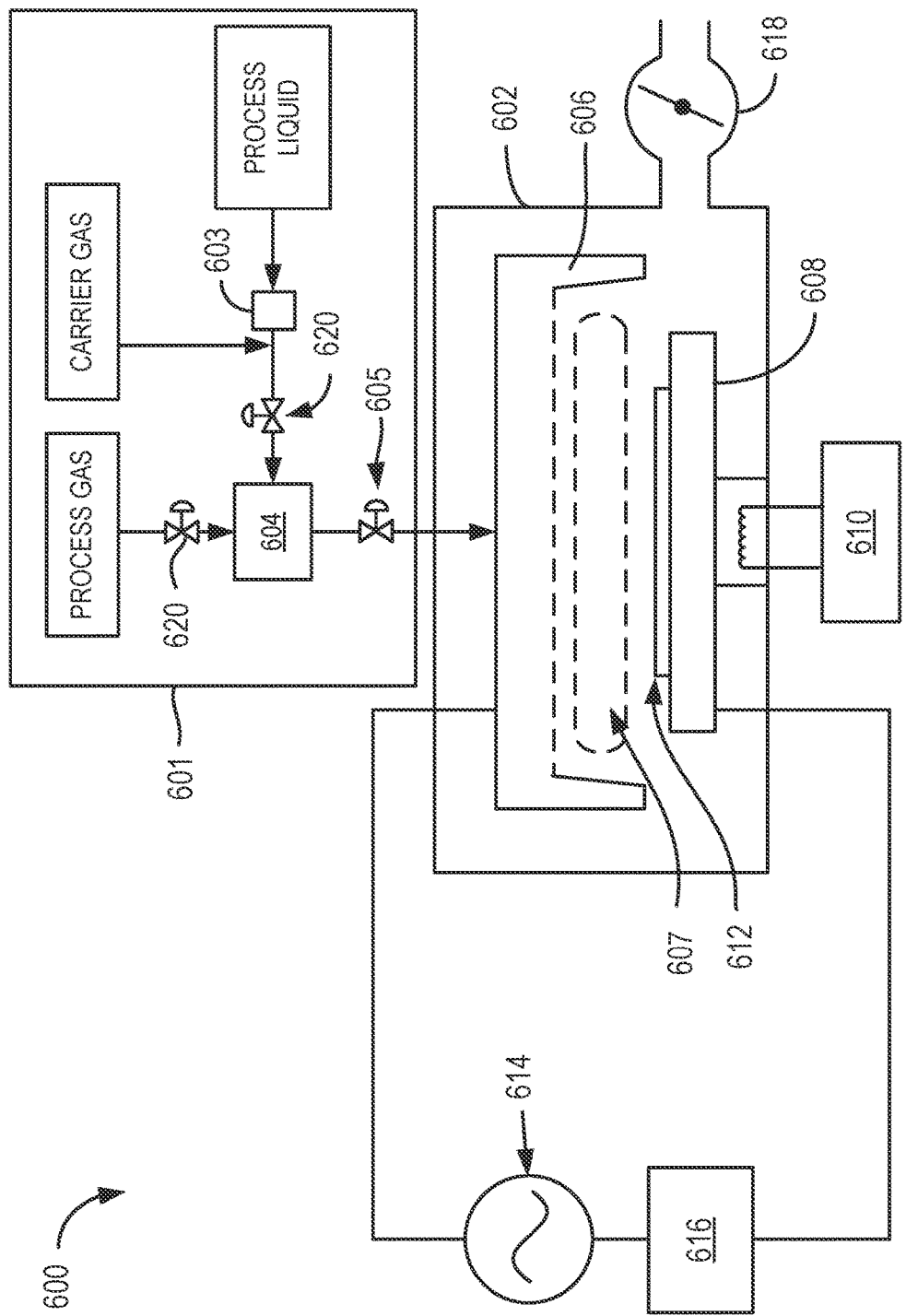
FIG. 6 shows a block diagram of an apparatus that may be used to carry out the disclosed methods.

FIG. 6 schematically shows an embodiment of a process station 600 that may be used to deposit material using atomic layer deposition (ALD) and/or chemical vapor deposition (CVD), either of which may be plasma enhanced. For simplicity, the process station 600 is depicted as a standalone process station having a process chamber body 602 for maintaining a low-pressure environment. However, it will be appreciated that a plurality of process stations 600 may be included in a common process tool environment. Further, it will be appreciated that, in some embodiments, one or more hardware parameters of process station 600, including those discussed in detail below, may be adjusted programmatically by one or more computer controllers.

Process station 600 fluidly communicates with reactant delivery system 601 for delivering process gases to a distribution showerhead 606. Reactant delivery system 601 includes a mixing vessel 604 for blending and/or conditioning process gases for delivery to showerhead 606. One or more mixing vessel inlet valves 620 may control introduction of process gases to mixing vessel 604. Similarly, a showerhead inlet valve 605 may control introduction of process gasses to the showerhead 606.

Some reactants, like BTBAS, may be stored in liquid form prior to vaporization at and subsequent delivery to the process station. For example, the embodiment of FIG. 6 includes a vaporization point 603 for vaporizing liquid reactant to be supplied to mixing vessel 604. In some embodiments, vaporization point 603 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 603 may be heat traced. In some examples, mixing vessel 604 may also be heat traced. In one non-limiting example, piping downstream of vaporization point 603 has an increasing temperature profile extending from approximately 100° C. to approximately 150° C. at mixing vessel 604.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 603. In one scenario, a liquid injector may be mounted directly to mixing vessel 604. In another scenario, a liquid injector may be mounted directly to showerhead 606.

In some embodiments, a liquid flow controller upstream of vaporization point 603 may be provided for controlling a mass flow of liquid for vaporization and delivery to process station 600. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 606 distributes process gases toward substrate 612. In the embodiment shown in FIG. 6, substrate 612 is located beneath showerhead 606, and is shown resting on a pedestal 608. It will be appreciated that showerhead 606 may have any suitable shape, and may have any suitable number and arrangement of ports for distributing processes gases to substrate 612.

In some embodiments, a microvolume 607 is located beneath showerhead 606. Performing an ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 608 may be raised or lowered to expose substrate 612 to microvolume 607 and/or to vary a volume of microvolume 607. For example, in a substrate transfer phase, pedestal 608 may be lowered to allow substrate 612 to be loaded onto pedestal 608. During a deposition process phase, pedestal 608 may be raised to position substrate 612 within microvolume 607. In some embodiments, microvolume 607 may completely enclose substrate 612 as well as a portion of pedestal 608 to create a region of high flow impedance during a deposition process.

Optionally, pedestal 608 may be lowered and/or raised during portions the deposition process to modulate process pressure, reactant concentration, etc., within microvolume 607. In one scenario where process chamber body 602 remains at a base pressure during the deposition process, lowering pedestal 608 may allow microvolume 607 to be evacuated. Example ratios of microvolume to process chamber volume include, but are not limited to, volume ratios between 1:600 and 1:10. It will be appreciated that, in some embodiments, pedestal height may be adjusted programmatically by a suitable computer controller.

In another scenario, adjusting a height of pedestal 608 may allow a plasma density to be varied during plasma activation and/or treatment cycles included in the deposition process. At the conclusion of the deposition process phase, pedestal 608 may be lowered during another substrate transfer phase to allow removal of substrate 612 from pedestal 608.

While the example microvolume variations described herein refer to a height-adjustable pedestal, it will be appreciated that, in some embodiments, a position of showerhead 606 may be adjusted relative to pedestal 608 to vary a volume of microvolume 607. Further, it will be appreciated that a vertical position of pedestal 608 and/or showerhead 606 may be varied by any suitable mechanism within the scope of the present disclosure. In some embodiments, pedestal 608 may include a rotational axis for rotating an orientation of substrate 612. It will be appreciated that, in some embodiments, one or more of these example adjustments may be performed programmatically by one or more suitable computer controllers.

Returning to the embodiment shown in FIG. 6, showerhead 606 and pedestal 608 electrically communicate with RF power supply 614 and matching network 616 for powering a plasma. In some embodiments, the plasma energy may be controlled by controlling one or more of a process station pressure, a gas concentration, an RF source power, an RF source frequency, and a plasma power pulse timing. For example, RF power supply 614 and matching network 616 may be operated at any suitable power to form a plasma having a desired composition of radical species. Examples of suitable powers are included above. Likewise, RF power supply 614 may provide RF power of any suitable frequency. In some embodiments, RF power supply 614 may be configured to control high- and low-frequency RF power sources independently of one another. Example low-frequency RF frequencies may include, but are not limited to, frequencies between 50 kHz and 600 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations, much shorter plasma strikes may be used. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, pedestal 608 may be temperature controlled via heater 610. Further, in some embodiments, pressure control for deposition process station 600 may be provided by butterfly valve 618. As shown in the embodiment of FIG. 6, butterfly valve 618 throttles a vacuum provided by a downstream vacuum pump (not shown). However, in some embodiments, pressure control of process station 600 may also be adjusted by varying a flow rate of one or more gases introduced to process station 600.

Figure 7:
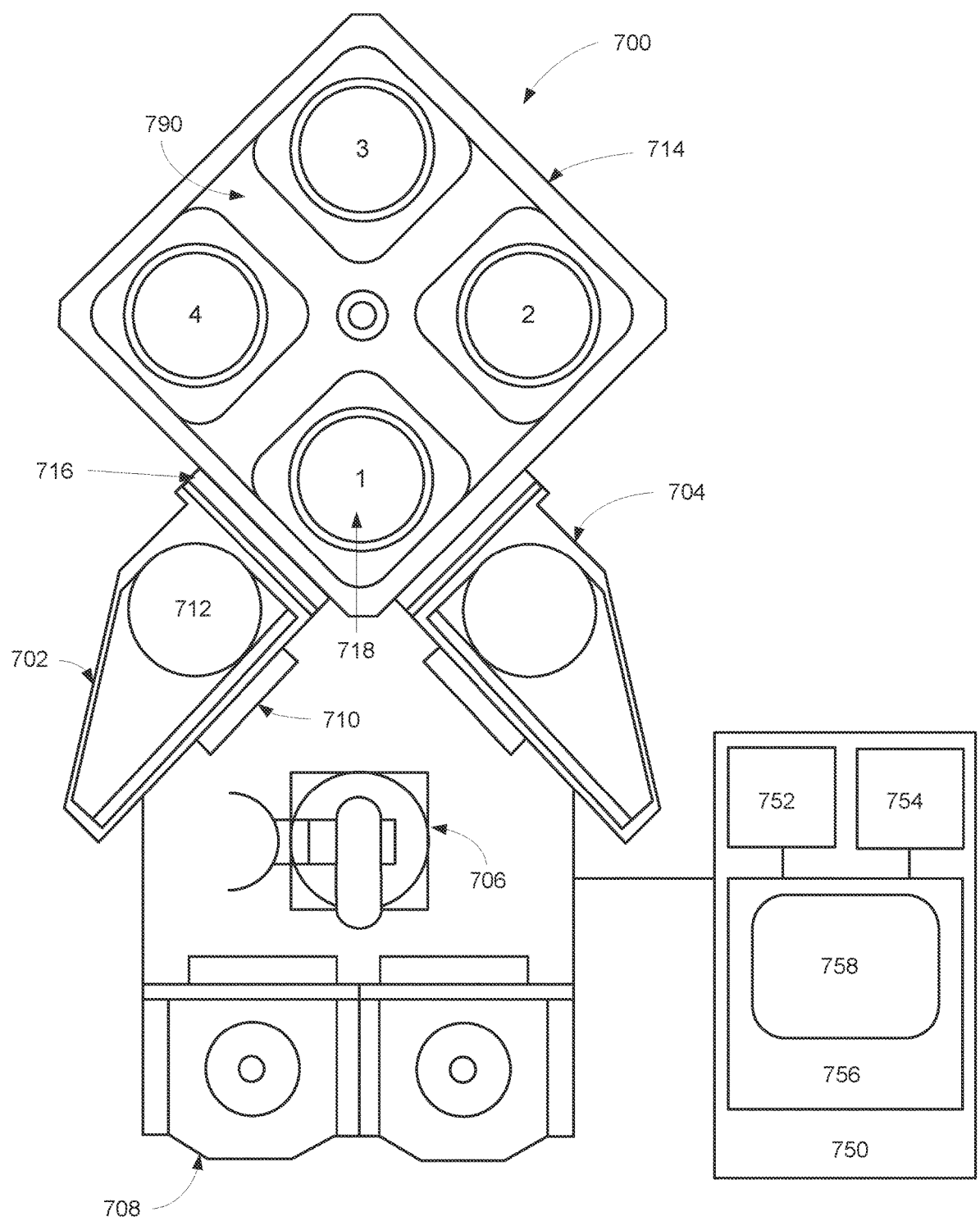
FIG. 7 depicts a multi-station apparatus that may be used to carry out the disclosed methods.

FIG. 7 shows a schematic view of an embodiment of a multi-station processing tool 700 with an inbound load lock 702 and an outbound load lock 704, either or both of which may comprise a remote plasma source. A robot 706, at atmospheric pressure, is configured to move wafers from a cassette loaded through a pod 708 into inbound load lock 702 via an atmospheric port 710. A wafer is placed by the robot 706 on a pedestal 712 in the inbound load lock 702, the atmospheric port 710 is closed, and the load lock is pumped down. Where the inbound load lock 702 comprises a remote plasma source, the wafer may be exposed to a remote plasma treatment in the load lock prior to being introduced into a processing chamber 714. Further, the wafer also may be heated in the inbound load lock 702 as well, for example, to remove moisture and adsorbed gases. Next, a chamber transport port 716 to processing chamber 714 is opened, and another robot (not shown) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

The depicted processing chamber 714 comprises four process stations, numbered from 1 to 4 in the embodiment shown in FIG. 7. Each station has a heated pedestal (shown at 718 for station 1), and gas line inlets. It will be appreciated that in some embodiments, each process station may have different or multiple purposes. While the depicted processing chamber 714 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 7 also depicts an embodiment of a wafer handling system 790 for transferring wafers within processing chamber 714. In some embodiments, wafer handling system 790 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 750 employed to control process conditions and hardware states of process tool 700. System controller 750 may include one or more memory devices 756, one or more mass storage devices 754, and one or more processors 752. Processor 752 may include a CPU or computer, analog and/or digital input/output connections, stepper motor controller boards, etc.

In some embodiments, system controller 750 controls all of the activities of process tool 700. System controller 750 executes system control software 758 stored in mass storage device 754, loaded into memory device 756, and executed on processor 752. System control software 758 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 700. System control software 758 may be configured in any suitable way. For example, various process tool component subroutines or control objects may be written to control operation of the process tool components necessary to carry out various process tool processes in accordance with the disclosed methods. System control software 758 may be coded in any suitable computer readable programming language.

In some embodiments, system control software 758 may include input/output control (IOC) sequencing instructions for controlling the various parameters described above. For example, each phase of a PEALD process may include one or more instructions for execution by system controller 750. The instructions for setting process conditions for a PEALD process phase may be included in a corresponding PEALD recipe phase. In some embodiments, the PEALD recipe phases may be sequentially arranged, so that all instructions for a PEALD process phase are executed concurrently with that process phase.

Other computer software and/or programs stored on mass storage device 754 and/or memory device 756 associated with system controller 750 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 718 and to control the spacing between the substrate and other parts of process tool 700.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameters adjusted by system controller 750 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the STRIKER® product family and the VECTOR® product family, each available from Lam Research Corp., of Fremont, California, or any of a variety of other commercially available processing systems. Two or more of the stations may perform the same functions. Similarly, two or more stations may perform different functions. Each station can be designed/configured to perform a particular function/method as desired.

Figure 8:
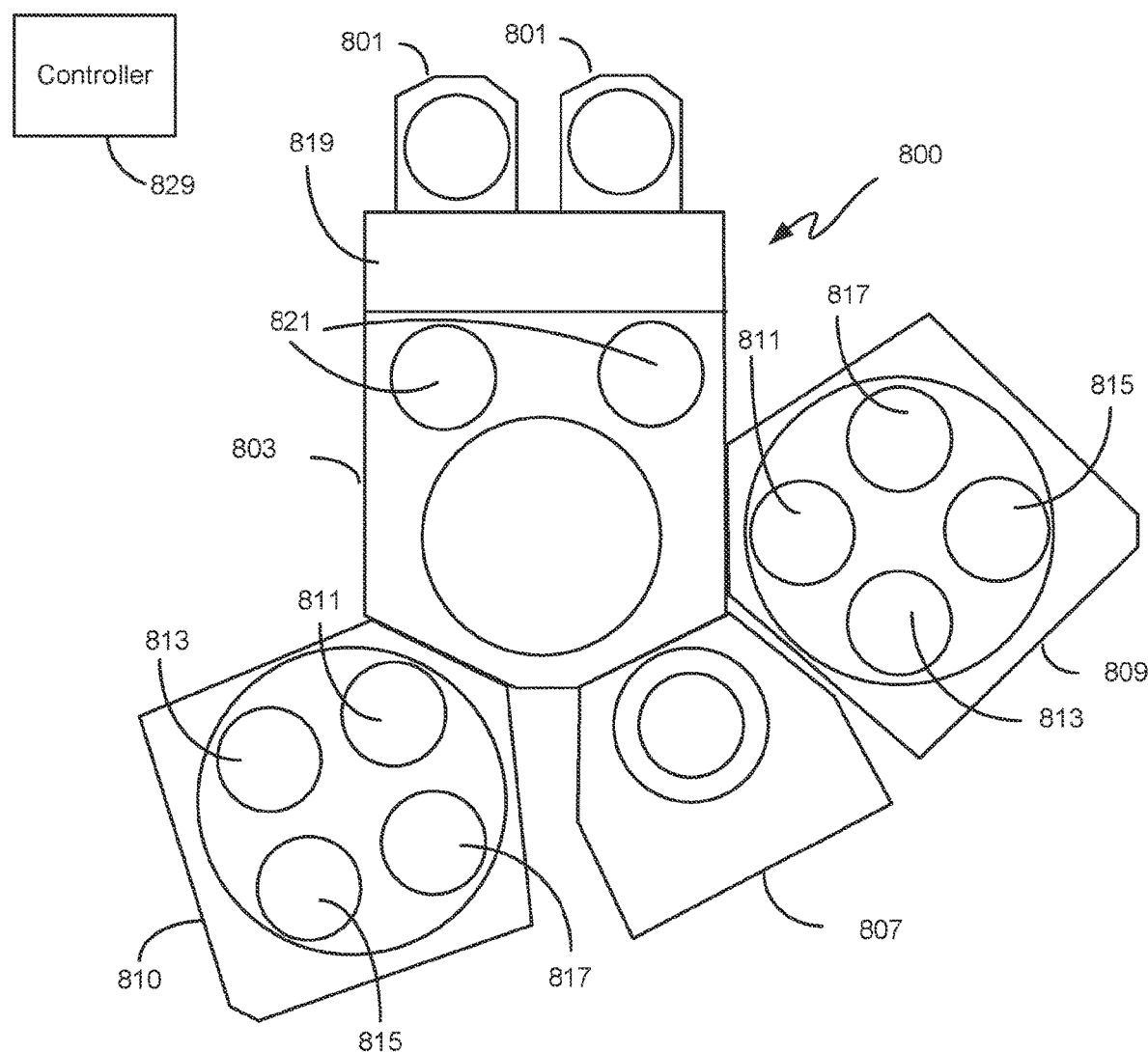
FIG. 8 depicts a multi-chamber processing tool that may be used to carry out the disclosed methods.

FIG. 8 is a block diagram of a processing system suitable for conducting thin film deposition processes in accordance with certain embodiments. The system 800 includes a transfer module 803. The transfer module 803 provides a clean, pressurized environment to minimize risk of contamination of substrates being processed as they are moved between various reactor modules. Mounted on the transfer module 803 are two multi-station reactors 809 and 810, each capable of performing atomic layer deposition (ALD) and/or chemical vapor deposition (CVD) according to certain embodiments. Reactors 809 and 810 may include multiple stations 811, 813, 815, and 817 that may sequentially or non-sequentially perform operations in accordance with disclosed embodiments. The stations may include a heated pedestal or substrate support, one or more gas inlets or showerhead or dispersion plate.

Also mounted on the transfer module 803 may be one or more single or multi-station modules 807 capable of performing plasma or chemical (non-plasma) pre-cleans, or any other processes described in relation to the disclosed methods. The module 807 may in some cases be used for various treatments to, for example, prepare a substrate for a deposition process. The module 807 may also be designed/configured to perform various other processes such as etching or polishing. The system 800 also includes one or more wafer source modules 801, where wafers are stored before and after processing. An atmospheric robot (not shown) in the atmospheric transfer chamber 819 may first remove wafers from the source modules 801 to loadlocks 821. A wafer transfer device (generally a robot arm unit) in the transfer module 803 moves the wafers from loadlocks 821 to and among the modules mounted on the transfer module 803.

In various embodiments, a system controller 829 is employed to control process conditions during deposition. The controller 829 will typically include one or more memory devices and one or more processors. A processor may include a CPU or computer, analog and/or digital input/output connections, stepper motor controller boards, etc.

The controller 829 may control all of the activities of the deposition apparatus. The system controller 829 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 829 may be employed in some embodiments.

Typically there will be a user interface associated with the controller 829. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 829. The signals for controlling the process are output on the analog and digital output connections of the deposition apparatus 800.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller 829 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 829, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method comprising:
providing a substrate having a gap to a processing chamber, the substrate having a top surface with the gap recessed from the top surface;
performing multiple plasma-enhanced atomic layer deposition (PEALD) cycles to fill the gap with a first dielectric film, wherein the first dielectric film is characterized by a first indentation over the gap and above the plane of the top surface; and
in the processing chamber, depositing a second dielectric film over the first dielectric film by a plasma enhanced chemical vapor deposition (PECVD) process, wherein the second dielectric film fills the first indentation and comprises a second indentation over the gap, the second indentation being at least 10% smaller than the first indentation.

2. The method of claim 1, wherein the second dielectric film fills the first indentation and comprises a second indentation that is at least 20% smaller than the first indentation.

3. The method of claim 1, wherein the second dielectric film fills the first indentation and comprises a second indentation that is at least 30% smaller than the first indentation.

4. The method of claim 1, wherein the second dielectric film is between 1 and 3 microns thick.

5. The method of claim 1, wherein the processing chamber is a multi-station processing chamber.

6. The method of claim 5, wherein the multiple PEALD cycles are performed in one or more first stations of the multi-station processing chamber and the PECVD process is performed in one or more second stations of the multi-station processing chamber, the first station being different stations than the second stations.

7. The method of claim 1, wherein after deposition of the second dielectric film, the substrate is ready for chemical-mechanical planarization (CMP).

8. The method of claim 1, further comprising, performing a CMP process to form a planarized surface comprising one or both of the first and second dielectric films.

9. A method comprising:
providing a substrate having a gap to a processing chamber, the substrate having a top surface with the gap recessed from the top surface;
performing multiple atomic layer deposition (ALD) cycles to fill the gap with a first dielectric film, wherein the first dielectric film is characterized by a first indentation over the gap and above the plane of the top surface; and
in the processing chamber, depositing a second dielectric film over the first dielectric film by a chemical vapor deposition (CVD) process, wherein the second dielectric film fills the first indentation and comprises a second indentation over the gap, the second indentation being at least 10% smaller than the first indentation.

10. The method of claim 9, wherein the second dielectric film fills the first indentation and comprises a second indentation that is at least 20% smaller than the first indentation.

11. The method of claim 9, wherein the second dielectric film fills the first indentation and comprises a second indentation that is at least 30% smaller than the first indentation.

12. The method of claim 9, wherein the second dielectric film is between 1 and 3 microns thick.

13. The method of claim 9, wherein the processing chamber is a multi-station processing chamber.

14. The method of claim 13, wherein the multiple ALD cycles are performed in one or more first stations of the multi-station processing chamber and the CVD process is performed in one or more second stations of the multi-station processing chamber, the first station being different stations than the second stations.

15. The method of claim 9, wherein after deposition of the second dielectric film, the substrate is ready for chemical-mechanical planarization (CMP).

16. The method of claim 9, further comprising, performing a CMP process to form a planarized surface comprising one or both of the first and second dielectric films.

17. A method comprising:
providing a substrate having a gap to a processing chamber, the substrate having a top surface with the gap recessed from the top surface;
performing multiple atomic layer deposition (ALD) cycles to fill the gap with a first dielectric film, wherein the first dielectric film is characterized by a first indentation over the gap and having a vertex at least 50 nm above the plane of the top surface; and
in the processing chamber, depositing a second dielectric film over the first dielectric film, including over the first indentation, by a chemical vapor deposition (CVD) process.

18. The method of claim 17, wherein the CVD process is a thermal CVD process.

* * * * *